United States Patent
Chau et al.

(10) Patent No.: US 6,890,807 B2
(45) Date of Patent: May 10, 2005

(54) METHOD FOR MAKING A SEMICONDUCTOR DEVICE HAVING A METAL GATE ELECTRODE

(75) Inventors: Robert Chau, Beaverton, OR (US); Mark Doczy, Beaverton, OR (US); Markus Kuhn, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 91 days.

(21) Appl. No.: 10/431,166

(22) Filed: May 6, 2003

(65) Prior Publication Data

US 2004/0222474 A1 Nov. 11, 2004

(51) Int. Cl.$^7$ .......................................... H01L 21/8238
(52) U.S. Cl. ............................................................ 438/199
(58) Field of Search .................................. 438/199, 202, 438/275, 592

(56) References Cited

U.S. PATENT DOCUMENTS

| | | | |
|---|---|---|---|
| 5,468,666 A | 11/1995 | Chapman | 437/44 |
| 5,625,217 A | 4/1997 | Chau et al. | 257/412 |
| 5,654,242 A | 8/1997 | Komatsu | |
| 5,753,560 A | 5/1998 | Hong et al. | 438/402 |
| 5,783,478 A | 7/1998 | Chau et al. | 438/592 |
| 5,891,798 A | 4/1999 | Doyle et al. | 438/624 |
| 6,010,929 A | 1/2000 | Chapman | 438/226 |
| 6,063,698 A | 5/2000 | Tseng et al. | 438/585 |
| 6,087,261 A | 7/2000 | Nishikawa et al. | 438/685 |
| 6,121,094 A | 9/2000 | Gardner et al. | 438/287 |
| 6,265,258 B1 | 7/2001 | Liang et al. | |
| 6,291,282 B1 | 9/2001 | Wilk et al. | |
| 6,303,418 B1 * | 10/2001 | Cha et al. | 438/199 |
| 6,306,742 B1 | 10/2001 | Doyle et al. | 438/591 |
| 6,391,802 B1 | 5/2002 | Delpech et al. | 438/785 |
| 6,436,777 B1 | 8/2002 | Ota | 438/305 |
| 6,475,874 B2 | 11/2002 | Xiang et al. | 438/396 |
| 6,514,828 B2 | 2/2003 | Ahn et al. | 438/297 |
| 6,617,209 B1 | 9/2003 | Chau et al. | 438/240 |
| 6,617,210 B1 | 9/2003 | Chau et al. | 438/240 |
| 2002/0197790 A1 | 12/2002 | Kizilyalli et al. | 438/240 |
| 2003/0045080 A1 | 3/2003 | Visokay et al. | 438/591 |

OTHER PUBLICATIONS

Doug Barlage et al., "High–Frequency Response of 100nm Integrated CMOS Transistors with High–K Gate Dielectrics", 2001 IEEE, 4 pages.
Robert Chau et al., A 50nm Depleted–Substrate CMOS Transistor (DST), 2001 IEEE, 4 pages.
Lu et al., "Dual–Metal Gate Technology for Deep–Submicron CMOS Devices", dated Apr. 29, 2003, 1 page.
Schwantes et al., "Performance Improvement of Metal Gate CMOS Technologies with Gigabit Feature Sizes", Technical University of Hanburg–Harburg, 5 pages.
Chau et al., "A Method of Making Semiconductor Device Having a High–K Gate Dielectric", U.S. Appl. No. 10/082, 530, filed Feb. 22, 2002.
Parker et al., "A Method of Making Semiconductor Device Having a High–K Gate Dielectric", U.S. Appl. No. 10/285, 915, filed Oct. 31, 2002.

(Continued)

*Primary Examiner*—Craig A. Thompson
(74) *Attorney, Agent, or Firm*—Mark V. Seeley

(57) ABSTRACT

A method for making a semiconductor device is described. That method comprises forming a dielectric layer on a substrate, and forming an impurity containing metal layer on the dielectric layer. A metal gate electrode is then formed from the impurity containing metal layer. Also described is a semiconductor device that comprises a metal gate electrode that is formed on a dielectric layer, which is formed on a substrate. The metal gate electrode includes a sufficient amount of an impurity to shift the workfunction of the metal gate electrode by at least about 0.1 eV.

6 Claims, 3 Drawing Sheets

OTHER PUBLICATIONS

Chau et al., "A Method of Making Semiconductor Device Having a High–K Gate Dielectric", U.S. Appl. No. 10/288,043, filed Nov. 5, 2002.

Parker et al., "A Method of Making Semiconductor Device Having a High–K Gate Dielectric", U.S. Appl. No. 10/315,268, filed Dec. 10, 2002.

Doczy et al., "A Method of Making Semiconductor Device Having a High–K Gate Dielectric", U.S. Appl. No. 10/338,174, filed Jan. 7, 2003.

Brask et al., "A Method of Making Semiconductor Device Having a High–K Gate Dielectric", U.S. Appl. No. 10/387,303, filed Mar. 11, 2003.

Brask et al., "A Method of Making Semiconductor Device Having a High–K Gate Dielectric", U.S. Appl. No. 10/391,816, filed Mar. 18, 2003.

Polishchuk et al., "Dual Workfunction CMOS Gate Technology Based on Metal Interdiffusion," www.eesc.berkeley.edu, 1 page.

Qiang Lu et al., "Metal Gate Work Function Adjustment for Future CMOS Technology" 2001 Symposium on VLSI Technology, Digest of Technical Papers, Kyoto Japan, Jun. 2001, pp. 45–46, XP010551992.

International Search Report PCT/US 03/40674.

* cited by examiner

METHOD FOR MAKING A SEMICONDUCTOR DEVICE HAVING A METAL GATE ELECTRODE

FIELD OF THE INVENTION

The present invention relates to methods for making semiconductor devices, in particular, semiconductor devices that include metal gate electrodes.

BACKGROUND OF THE INVENTION

MOS field-effect transistors with very thin gate dielectrics made from silicon dioxide may experience unacceptable gate leakage currents. Forming the gate dielectric from certain high-k dielectric materials, instead of silicon dioxide, can reduce gate leakage. Such a dielectric may not, however, be compatible with polysilicon. For that reason, it may be desirable to replace polysilicon based gate electrodes with metal gate electrodes for devices that include high-k gate dielectrics.

The optimal workfunction for a metal gate electrode will differ depending upon whether it is used to form an NMOS transistor or a PMOS transistor. When the same material is used to make metal gate electrodes for NMOS and PMOS transistors, the gate electrodes cannot demonstrate the desired workfunction for both types of devices. If a material is chosen to ensure an acceptable workfunction for an NMOS transistor's gate electrode, then the workfunction for the PMOS transistor's gate electrode will be unsatisfactory. Similarly, choosing a material that ensures an acceptable workfunction for the PMOS transistor's gate electrode will prevent the NMOS transistor's gate electrode from having a suitable workfunction. Selecting a midgap material (i.e., a material that gives the metal gate electrodes for NMOS and PMOS transistors an intermediate workfunction) will yield a suboptimal workfunction for both transistors.

It may be possible to address this problem by forming the NMOS transistor's metal gate electrode from a first material and the PMOS transistor's metal gate electrode from a second material. The first material may ensure an acceptable workfunction for the NMOS gate electrode, while the second material may ensure an acceptable workfunction for the PMOS gate electrode. Processes for forming such dual metal gate devices may, however, be complex and expensive.

Accordingly, there is a need for an improved process for making a semiconductor device that includes a metal gate electrode. There is a need for a relatively inexpensive and uncomplicated process for making a device with metal gate electrodes that demonstrate optimal workfunctions for both NMOS and PMOS transistors. The method of the present invention provides such a process.

Figure 1A:
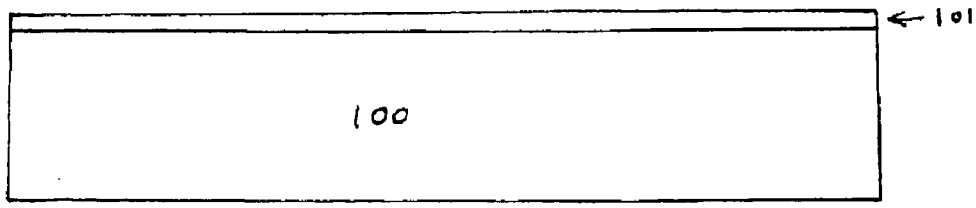
FIGS. 1a–1d represent cross-sections of structures that may be formed when carrying out an embodiment of the method of the present invention.
Figure 1B:
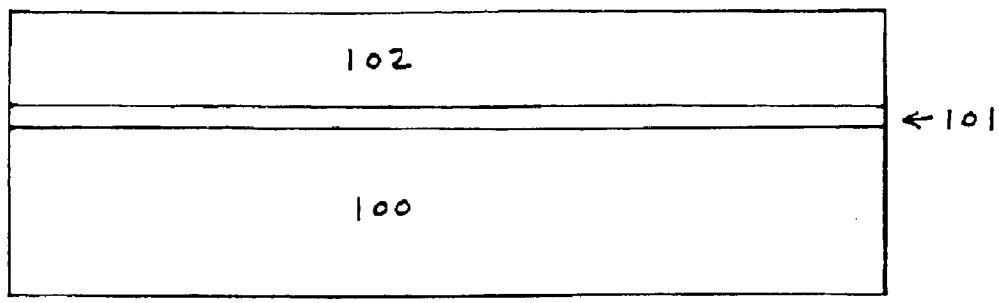

Features shown in these figures are not intended to be drawn to scale.

DETAILED DESCRIPTION OF THE PRESENT INVENTION

A method for making a semiconductor device is described. That method comprises forming a dielectric layer on a substrate, and forming an impurity containing metal layer on the dielectric layer. A metal gate electrode is then formed from the impurity containing metal layer. Also described is a semiconductor device that includes a metal gate electrode. That device comprises a dielectric layer formed on a substrate, and a metal gate electrode that is formed on the dielectric layer. The metal gate electrode includes a sufficient amount of an impurity to shift the workfunction of the metal gate electrode by at least about 0.1 eV.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

FIGS. 1a–1d illustrate structures that may be formed, when carrying out an embodiment of the method of the present invention. Initially, dielectric layer 101 is formed on substrate 100, generating the FIG. 1 a structure. Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although several examples of materials from which substrate 100 may be formed are described here, any material that may serve as a foundation upon which a semiconductor device may be built falls within the spirit and scope of the present invention.

Dielectric layer 101 preferably comprises a high-k gate dielectric layer. Some of the materials that may be used to make high-k gate dielectrics include: hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, titanium oxide, and aluminum oxide. Although a few examples of materials that may be used to form dielectric layer 101 are described here, that layer may be made from other materials that serve to reduce gate leakage.

Dielectric layer 101 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and dielectric layer 101. The CVD reactor should be operated long enough to form a layer with the desired thickness. In most applications, dielectric layer 101 should be less than about 60 angstroms thick, and more preferably between about 5 angstroms and about 40 angstroms thick.

After dielectric layer 101 is formed on substrate 100, a metal gate electrode is formed on dielectric layer 101. In a preferred embodiment, the metal gate electrode is formed by initially forming metal layer 102 on dielectric layer 101—generating the FIG. 1b structure. Metal layer 102 may comprise any conductive material from which a metal gate electrode may be derived. Preferably, metal layer 102 has etch and thermal stability characteristics that render it suitable for making metal gate electrodes for semiconductor devices. In this regard, it may be desirable for metal layer 102 to tolerate relatively high temperatures, e.g., temperatures that exceed about 900° C. If metal layer 102 can withstand such relatively high temperatures, it may be easier to integrate that layer into the overall process for making the semiconductor device.

Examples of high temperature resistant materials, from which metal layer 102 may be made, include tungsten, platinum, ruthenium, palladium, molybdenum and niobium, as well as alloys formed form these and other elements. Metal layer 102 may alternatively comprise other, less conductive, metal compounds. Such compounds include metal carbides, e.g., titanium carbide, zirconium carbide, tantalum carbide, and tungsten carbide, metal nitrides, e.g., titanium nitride and tantalum nitride, and conductive metal oxides, e.g., ruthenium oxide.

Although metal layer 102 preferably comprises materials that may withstand high temperature anneal processes, metal layer 102 may comprise other materials, e.g., aluminum, titanium, or tantalum. Although a few examples of materials that may be used to form metal layer 102 are described here, that layer may be made from many other materials. The term "metal layer," as used in this application, thus encompasses any conductive material from which a metal gate electrode (i.e., a gate electrode that does not contain a meaningful amount of silicon or polysilicon) may be derived.

Metal layer 102 may be formed on dielectric layer 101 using a conventional CVD or PVD process, e.g., a conventional atomic layer CVD process, and preferably is between about 50 angstroms and about 2,000 angstroms thick. Dopants may be added to metal layer 102, as it is formed. For example, when a CVD process is used to make layer 102, dopants may be integrated into layer 102 as it is deposited. Because the amount of dopant that is introduced into layer 102 may vary depending upon the deposition temperature, it may be possible to change the dopant level by changing the temperature. As an example, decreasing the deposition temperature may cause the amount of chlorine that is added to metal layer 102 to increase. The resulting dopant concentration may also be affected by the type and quantity of elements that are included in the process gases, which are fed into the CVD reactor.

Metal layers that are doped as they are deposited fall within the definition of "metal layer," as that term is used in this application. Because those skilled in the art are familiar with equipment, materials, and procedures that may be used to form metal layer 102 on dielectric layer 101, additional detail about this process step will not be provided.

As deposited, metal layer 102 may not be suitable for forming a gate electrode if it lacks an acceptable workfunction. In this embodiment of the present invention, impurities are added to metal layer 102 to shift its workfunction. Those impurities may comprise one or more elements that raise or lower metal layer 102's workfunction, when added to it. In a preferred embodiment, a sufficient amount of that element, or elements, is added to layer 102 to shift that layer's workfunction by at least about 0.1 eV. When forming an NMOS transistor from layer 102, an element with relatively low electronegativity, e.g., an electronegativity value that is less than about 1.7, should be used. When forming a PMOS transistor, an element with relatively high electronegativity, e.g., an electronegativity value that is greater than about 2.8, should be used.

Figure 2:
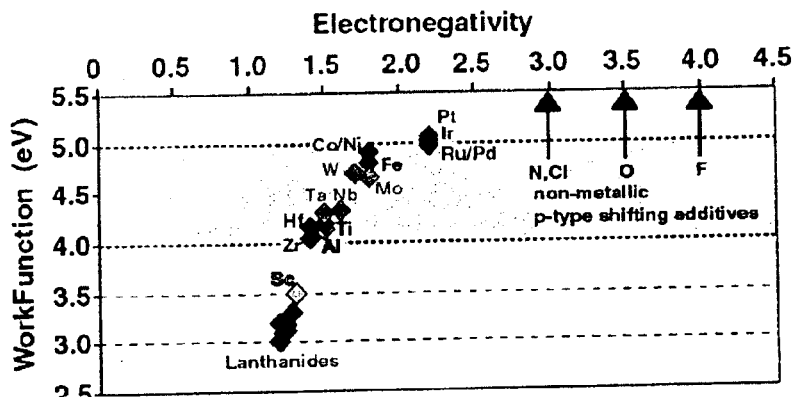
FIG. 2 provides a chart showing how various elements' workfunctions scale with their electronegativity.

FIG. 2 provides a chart showing how a material's workfunction scales with electronegativity. Adding to metal layer 102 a significant quantity of a material with a relatively high electronegativity will raise the workfunction of metal layer 102, while adding to metal layer 102 a significant quantity of a material with a relatively low electronegativity will lower the workfunction of metal layer 102. As is apparent from this chart, elements that may reduce the workfunction of a midgap film (e.g., a film with a workfunction that is between about 4.3 eV and about 4.9 eV), rendering it suitable for forming an NMOS gate electrode, include: lanthanide metals, scandium, zirconium, hafnium, aluminum, titanium, tantalum, niobium, and tungsten. Other potentially useful elements include the alkali metals and alkaline earth metals. Aluminum and cerium may be particularly preferred elements for reducing the workfunction of metal layer 102. Elements that may increase the workfunction of a midgap film, rendering it suitable for forming a PMOS gate electrode, include: nitrogen, chlorine, oxygen, fluorine, and bromine. Chlorine may be a particularly preferred element for raising the workfunction of metal layer 102.

The elements that best serve to raise or lower the workfunction of metal layer 102 to the desired level will depend upon metal layer 102's composition and properties. Even elements with an electronegativity value as low as 2.2 (e.g., platinum, palladium, ruthenium, and iodine) may raise the workfunction of some metal layers. Although a few examples of the elements, which can shift metal layer 102's workfunction, are identified here, other elements may be used instead. The process of the present invention thus contemplates the use of any element that may serve to modify metal layer 102's workfunction. Whether it is best to add a single element to layer 102, or instead add multiple elements, may depend upon the application.

Figure 1C:
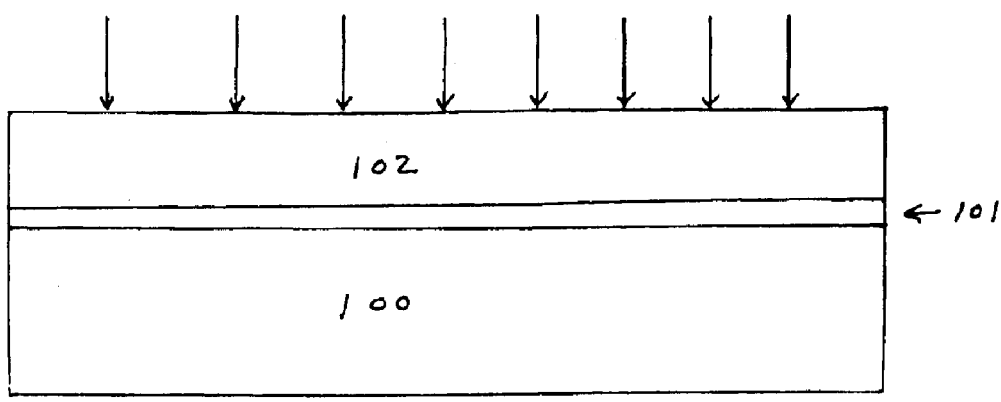

The workfunction shifting elements identified above may be added to metal layer 102 using any conventional doping process. Examples of such processes include ion implantation, plasma enhanced ion implantation, furnace diffusion, and plasma deposition. Such elements may also be added to metal layer 102 by first depositing a film that contains them onto the surface of layer 102, then causing material from that film to diffuse into layer 102. FIG. 1c illustrates the use of an ion implantation process to introduce workfunction shifting elements into metal layer 102. Because those skilled in the art are familiar with the equipment, materials, and steps that may be used to add such elements to metal layer 102, additional detail about this process step will be omitted.

The optimal concentration of the impurity, or impurities, that is added to metal layer 102 to shift its workfunction to the targeted level will depend upon the composition and properties of layer 102 (including its initial workfunction), the type of impurity used, and the target workfunction. The amount of a first impurity needed to shift metal layer 102's workfunction from 4.3 eV to 4.2 eV (e.g., to tailor layer 102 for an NMOS application) will very likely be substantially less than the amount of a second impurity needed to shift the workfunction from 4.3 eV to 5.0 eV (e.g., to tailor layer 102 for a PMOS application). In most applications, adding a suitable element to metal layer 102 until it comprises between about 3 and about 50 atomic percent of the resulting impurity containing metal layer should be sufficient to shift the workfunction to an acceptable degree. In many applications, it should suffice to add the impurity until it comprises between about 5 and about 20 atomic percent of the resulting layer.

Figure 1D:
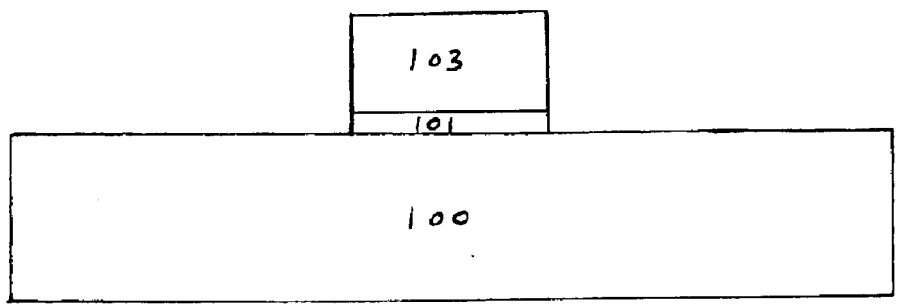

After impurities are added to layer 102, conventional techniques may be used to etch that layer and layer 101 to form metal gate electrode 103, as shown in FIG. 1*d*. Subsequent steps for completing the transistor, e.g., forming source and drain regions, and the device's contacts, are well known to those skilled in the art and will not be described in more detail here.

FIGS. 3*a*–3*d* represent cross-sections of structures that may be formed when carrying out a second embodiment of the method of the present invention. In this embodiment, the method of the present invention is used to form a CMOS device with NMOS and PMOS transistors that have acceptable workfunctions.

Figure 3A:
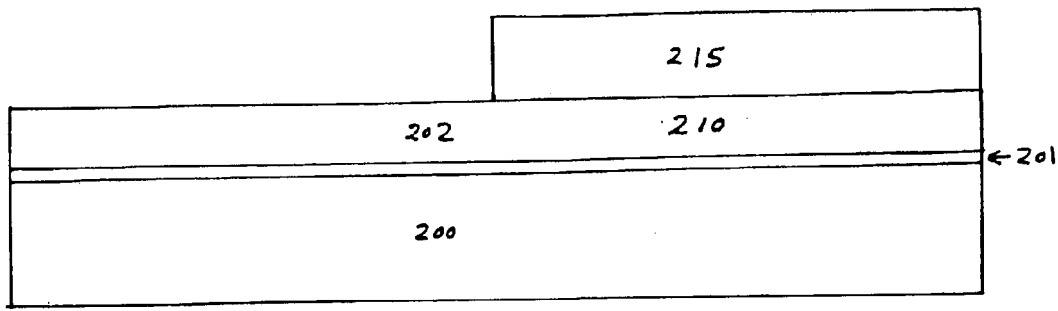
FIGS. 3a–3d represent cross-sections of structures that may be formed when carrying out a second embodiment of the method of the present invention.
Figure 3B:
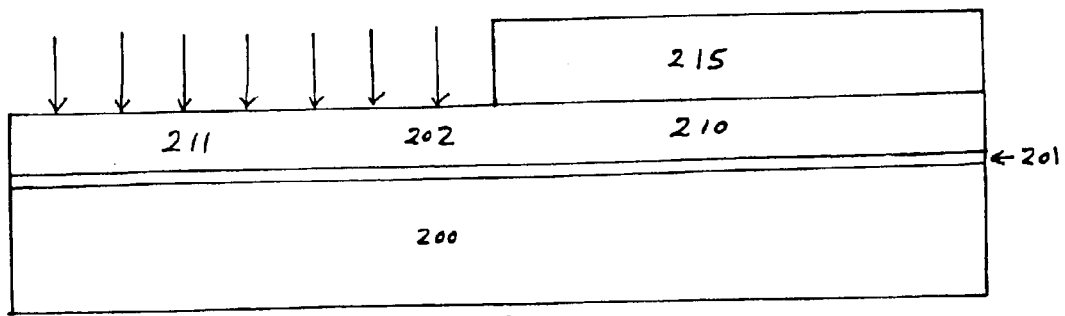

After forming metal layer 202 on dielectric layer 201 (e.g., using the materials and process steps described above), portion 210 of metal layer 202 is masked, e.g., by photoresist 215, generating the FIG. 3*a* structure. In a preferred embodiment, metal layer 202 has a workfunction of between about 4.3 eV and about 4.9 eV. The PMOS transistor for the CMOS device will be created where metal layer 202 is masked, while the NMOS transistor for the CMOS device will be created where metal layer 202 remains exposed. After masking portion 210, impurities are added to exposed portion 211 of metal layer 202, as illustrated in FIG. 3*b*. The impurities comprise one or more of the elements specified above, and may be added to metal layer 202 using any of the processes described previously.

When an NMOS transistor will be formed where metal layer 202 is exposed, an element should be selected that will shift the workfunction of metal layer 202 to a level suitable for the metal gate electrode for an NMOS transistor. In a preferred embodiment, a sufficient amount of a first element should be added to exposed portion 211 of metal layer 202 to lower the workfunction of that first portion of that layer to between about 4.0 eV and about 4.2 eV. Elements suitable for NMOS transistor fabrication are identified above.

Figure 3C:
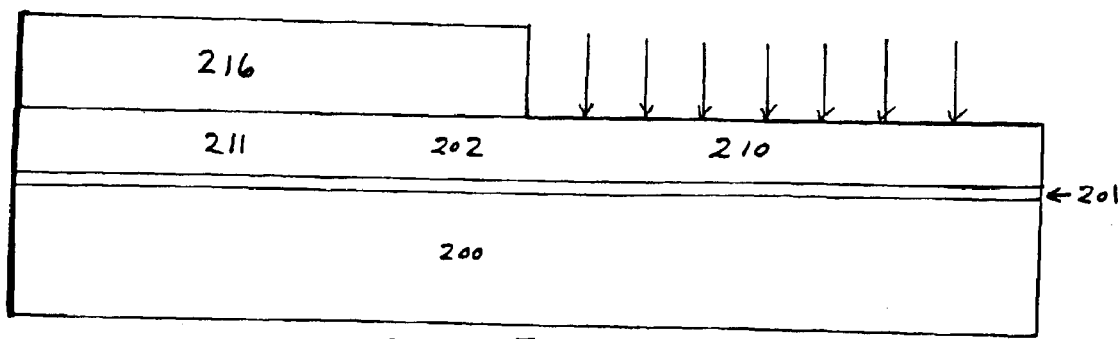

After doping exposed portion 211 with an element that shifts the workfunction of that portion of metal layer 202 to a level favorable for an NMOS transistor, portion 211 is masked (e.g., by photoresist 216) and portion 210 is exposed. After masking portion 211, impurities are added to exposed portion 210, as illustrated in FIG. 3*c*. When a PMOS transistor will be formed where metal layer 202 is exposed, an element should be selected that will shift the workfunction of metal layer 202 to a level suitable for the metal gate electrode for a PMOS transistor. In a preferred embodiment, a sufficient amount of a second element should be added to exposed portion 210 of metal layer 202 to raise the workfunction of that second portion of that layer to between about 5.0 eV and about 5.2 eV. Elements suitable for PMOS transistor fabrication are identified above.

The order in which different portions of metal layer 202 are doped is unimportant. As illustrated, a first portion of metal layer 202 may be doped with an element that has a relatively low electronegativity value before a second portion of metal layer 202 is doped with an element that has a relatively high electronegativity value. This embodiment of the present invention also contemplates, however, a process in which a first portion of layer 202 is doped with an element that has a relatively high electronegativity value before a second portion of metal layer 202 is doped with an element that has a relatively low electronegativity value.

As mentioned above, the optimal concentration of the impurities that are added to metal layer 202 to adequately reduce the workfunction of a first portion of that layer and to increase the workfunction of a second portion of that layer will depend upon the composition and properties of layer 202, the type of impurities used, and the target workfunctions. In most applications, it should suffice to add the impurities to the metal layer until they comprise between about 3 and about 50 atomic percent of the first and second portions, respectively, of the resulting impurity containing metal layer.

It has been found that the workfunction of a first portion of a titanium carbide metal layer—with a workfunction of about 4.5 eV—may be shifted to a value of about 4.2 eV by adding a sufficient amount of aluminum to generate a layer that includes about 11 atomic percent aluminum. The workfunction of a second portion of such a metal layer may be shifted to a value of about 5.1 eV by adding a sufficient amount of chlorine to generate a layer that includes about 12 atomic percent chlorine.

Figure 3D:
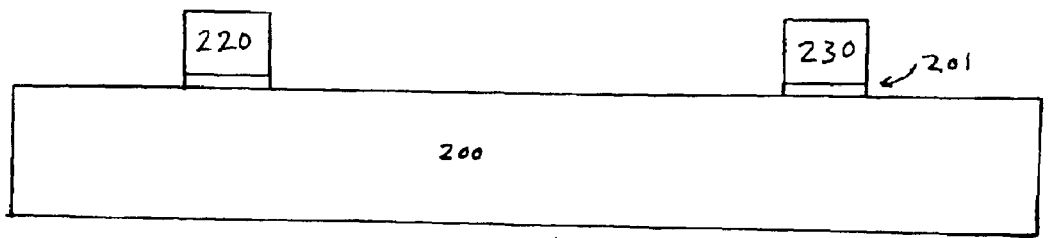

After the workfunctions of different portions of metal layer 202 have been shifted to enable gate electrodes with acceptable electrical properties to be derived from metal layer 202 for both NMOS and PMOS transistors, metal layer 202 and dielectric layer 201 may be etched, generating the FIG. 3*d* structure. That structure will include NMOS gate electrode 220, which will have a workfunction suitable for an NMOS transistor, and PMOS gate electrode 230, which will have a workfunction suitable for a PMOS transistor. Because those skilled in the art are familiar with the steps for completing the NMOS and PMOS transistors, a further description of those steps will be omitted.

The method of the present invention enables a single metal layer to be modified with different impurities (e.g., those with relatively high or relatively low electronegativity values), allowing gate electrodes to be made from that layer that have optimum workfunctions—regardless of whether they form NMOS or PMOS gate electrodes. The method described above thus enables manufacture of CMOS devices that include metal gate electrodes with appropriate workfunctions for both NMOS and PMOS transistors without having to perform the complex and costly process steps that dual metal gate electrode processes require.

Although the embodiments described above provide examples of processes for modifying a metal layer to enable it to be used to make both NMOS and PMOS gate electrodes with acceptable workfunctions, the present invention is not limited to these particular embodiments, but instead contemplates other processes for modifying a metal layer to enable it to be used in this way.

In addition to the methods set forth above, applicants' invention contemplates a semiconductor device that comprises dielectric layer 101, which is formed on substrate 100, and metal gate electrode 103, which is formed on dielectric layer 101. As described above, metal gate electrode 103 includes a sufficient amount of an impurity to shift its workfunction by at least about 0.1 eV. The metal gate electrode for this semiconductor device may serve as the gate electrode for an NMOS transistor. In that case, the impurity preferably is an element that has an electronegativity value that is less than about 1.7. When the metal gate electrode serves as the gate electrode for a PMOS transistor, the impurity preferably is an element that has an electronegativity that is greater than about 2.8. Also, as indicated above, the impurity, or impurities, preferably are present in the metal gate electrode at a concentration of between about 3 and about 50 atomic percent.

When the semiconductor device comprises a CMOS transistor, it will include a first metal gate electrode and a second metal gate electrode. The first metal gate electrode preferably includes a sufficient amount of a first element to lower the workfunction of the first metal gate electrode by at least about 0.1 eV, and the second metal gate electrode preferably includes a sufficient amount of a second element to raise the workfunction of the second metal gate electrode by at least about 0.1 eV. When the first metal gate electrode serves as the gate electrode for an NMOS transistor, the first element preferably has an electronegativity value that is less than about 1.7. When the second metal gate electrode serves as the gate electrode for a PMOS transistor, the second element preferably has an electronegativity value that is greater than about 2.8

Although the semiconductor device that is described and claimed in this application may be made using the processes set forth in detail above, it may alternatively be formed using other types of processes. For that reason, the semiconductor device of the present invention is not intended to be limited to devices that may be made using the processes described above.

Although the foregoing description has specified certain steps and materials that may be used in the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a CMOS transistor comprising:

forming a high-k gate dielectric layer on a substrate; and forming an impurity containing metal layer on the high-k gate dielectric layer;

wherein a first portion of the impurity containing metal layer includes a sufficient amount of a first element to lower the metal layer's workfunction and wherein a second portion of the impurity containing metal layer includes a sufficient amount of a second element to raise the metal layer's workfunction.

2. The method of claim 1 further comprising forming a gate electrode for an NMOS transistor from the first portion of the impurity containing metal layer, and forming a gate electrode for a PMOS transistor from the second portion of the impurity containing metal layer, and wherein the first element has an electronegativity value that is less than about 1.7, and the second element has an electronegativity value that is greater than about 2.8.

3. The method of claim 1 wherein the impurity containing metal layer is formed by:

forming a metal layer that has a workfunctlon of between about 4.3 eV and about 4.9 eV; and then adding to a first portion of the metal layer a sufficient amount of a first element to lower the metal layer's workfunction to between about 4.0 eV and about 4.2 eV, and adding to a second portion of the metal layer a sufficient amount of a second element to raise the metal layer's workfunction to between about 5.0 eV and about 5.2 eV.

4. The method of claim 3 wherein the first element is added to the first portion of the metal layer while the second portion of the metal layer is masked, and the second element is added to the second portion of the metal layer while the first portion of the metal layer is masked.

5. The method of claim 4 wherein the first element is selected from the group consisting of a lanthanide metal, scandium, zirconium, hafnium, aluminum, titanium, tantalum, niobium, and tungsten, and the second element is selected from the group consisting of nitrogen, chlorine, oxygen, fluorine, and bromine.

6. The method of claim 5 wherein the first element is added to the metal layer until it comprises between about 3 and about 50 atomic percent of the first portion of the impurity containing metal layer, and the second element is added to the metal layer until it comprises between about 3 and about 50 atomic percent of the second portion of the impurity containing metal layer.

* * * * *